(12) United States Patent
Kitajima

(10) Patent No.: US 9,844,138 B2
(45) Date of Patent: Dec. 12, 2017

(54) MULTILAYER WIRING BOARD

(71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 152 days.

(21) Appl. No.: 14/933,268

(22) Filed: Nov. 5, 2015

(65) Prior Publication Data

US 2016/0057862 A1 Feb. 25, 2016

Related U.S. Application Data

(63) Continuation of application No. PCT/JP2014/061525, filed on Apr. 24, 2014.

(30) Foreign Application Priority Data

May 8, 2013 (JP) ................. 2013-098465

(51) Int. Cl.
*H04M 1/00* (2006.01)
*H05K 1/11* (2006.01)
(Continued)

(52) U.S. Cl.
CPC ........ *H05K 1/116* (2013.01); *H01L 23/49822* (2013.01); *H01L 23/49827* (2013.01);
(Continued)

(58) Field of Classification Search
CPC ......... H01L 2924/00; H01L 2924/0002; H01L 23/49822; H01L 23/49827;
(Continued)

(56) References Cited

U.S. PATENT DOCUMENTS

2004/0013860 A1 1/2004 Sumi et al.
2004/0203552 A1 10/2004 Horiuchi et al.
(Continued)

FOREIGN PATENT DOCUMENTS

CN 1476287 A 2/2004
CN 101213890 A 7/2008
(Continued)

OTHER PUBLICATIONS

Official Communication issued in International Patent Application No. PCT/JP2014/061525, dated Jun. 10, 2014.
(Continued)

*Primary Examiner* — Shaima Q Aminzay
(74) *Attorney, Agent, or Firm* — Keating & Bennett, LLP

(57) ABSTRACT

A method reduces an area of a mounting electrode provided on a first surface of a multilayer body and connected to a specific component is reduced and decreases a pitch between mounting electrodes. A plating film is formed on the mounting electrodes with the reduced area. The mounting electrodes for connection to specific components are defined by first end surfaces of first via conductors, and hence, the areas of the mounting electrodes are significantly reduced, and the pitch between the mounting electrodes is significantly decreased. Also, the mounting electrodes defined by the first end surfaces of the first via conductors are connected to plane electrodes at end surfaces of second via conductors exposed from a surface of the multilayer body with internal wiring electrodes interposed therebetween. Thus, a plating film is able to be reliably provided on the mounting electrodes.

17 Claims, 6 Drawing Sheets

(51) Int. Cl.
*H01L 23/498* (2006.01)
*H01L 23/50* (2006.01)
*H05K 3/46* (2006.01)
*H01L 23/66* (2006.01)
*H04M 1/02* (2006.01)
*H05K 1/02* (2006.01)
*H05K 1/09* (2006.01)
*H05K 3/24* (2006.01)

(52) U.S. Cl.
CPC ........ *H01L 23/49838* (2013.01); *H01L 23/50* (2013.01); *H01L 23/66* (2013.01); *H04M 1/0202* (2013.01); *H05K 1/0298* (2013.01); *H05K 1/09* (2013.01); *H05K 1/114* (2013.01); *H05K 3/244* (2013.01); *H05K 3/4611* (2013.01); *H01L 2223/6666* (2013.01); *H01L 2223/6677* (2013.01); *H01L 2224/16225* (2013.01); *H01L 2224/73204* (2013.01); *H01L 2924/1305* (2013.01); *H01L 2924/15311* (2013.01); *H05K 1/113* (2013.01); *H05K 2201/09781* (2013.01); *H05K 2201/1003* (2013.01); *H05K 2201/10015* (2013.01); *H05K 2201/10098* (2013.01)

(58) Field of Classification Search
CPC ........ H01L 2924/1305; H01L 2224/16; H01L 23/528; H01L 27/124; H01L 27/1248; H01L 2924/12044; H01L 2924/19105; H01L 2223/6666
USPC .......... 455/550.1, 575.1, 333, 334; 257/774; 174/251, 262
See application file for complete search history.

(56) References Cited

U.S. PATENT DOCUMENTS

| | | |
|---|---|---|
| 2006/0055028 A1 | 3/2006 | Hasunuma |
| 2008/0037199 A1 | 2/2008 | Fukudome et al. |
| 2008/0093117 A1* | 4/2008 | Oikawa .................. H01L 23/15 174/262 |
| 2008/0261005 A1 | 10/2008 | Nomiya et al. |
| 2010/0224396 A1 | 9/2010 | Nomiya |
| 2012/0119377 A1* | 5/2012 | Muramatsu ....... H01L 23/49822 257/774 |
| 2014/0022699 A1 | 1/2014 | Wakaki et al. |

FOREIGN PATENT DOCUMENTS

| | | |
|---|---|---|
| CN | 101874429 A | 10/2010 |
| JP | 08-125339 A | 5/1996 |
| JP | 2004-297456 A | 10/2004 |
| JP | 2006-080333 A | 3/2006 |
| JP | 2007-115952 A | 5/2007 |
| JP | 2008-066712 A | 3/2008 |
| JP | 2008-300482 A | 12/2008 |
| JP | 2010-192774 A | 9/2010 |
| JP | 2012-104774 A | 5/2012 |
| JP | 2013-026583 A | 2/2013 |
| WO | 2007/007451 A1 | 1/2007 |
| WO | 2007/094123 A1 | 8/2007 |
| WO | 2012/132762 A1 | 10/2012 |

OTHER PUBLICATIONS

Official Communication issued in corresponding Japanese Patent Application No. 2015-515841, dated Nov. 22, 2016.

* cited by examiner

FIG. 2
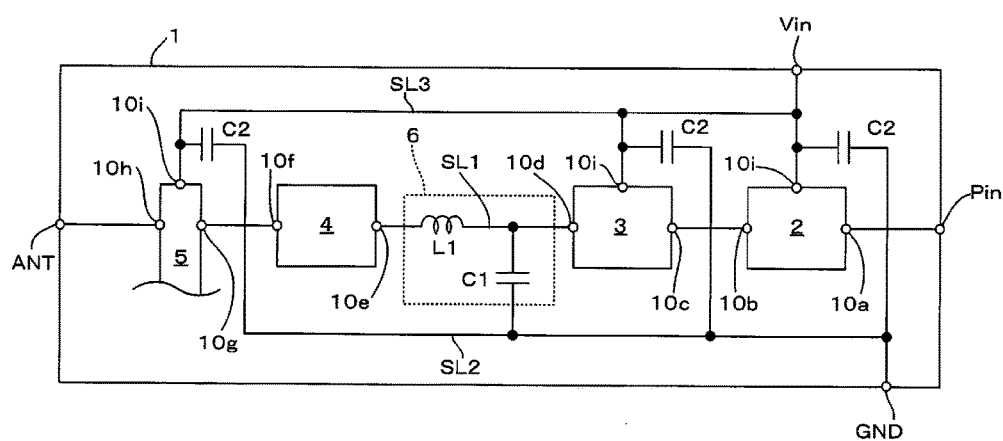
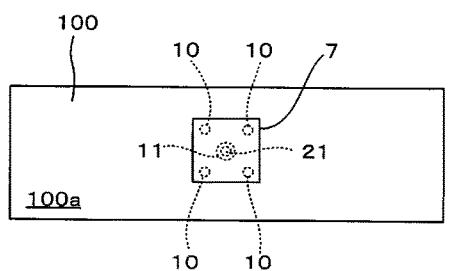
FIG. 3A
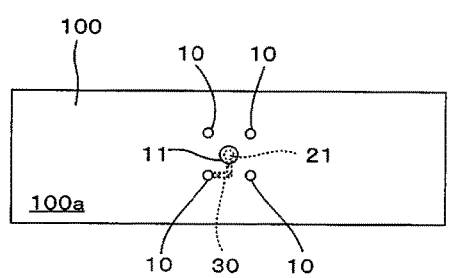
FIG. 3B

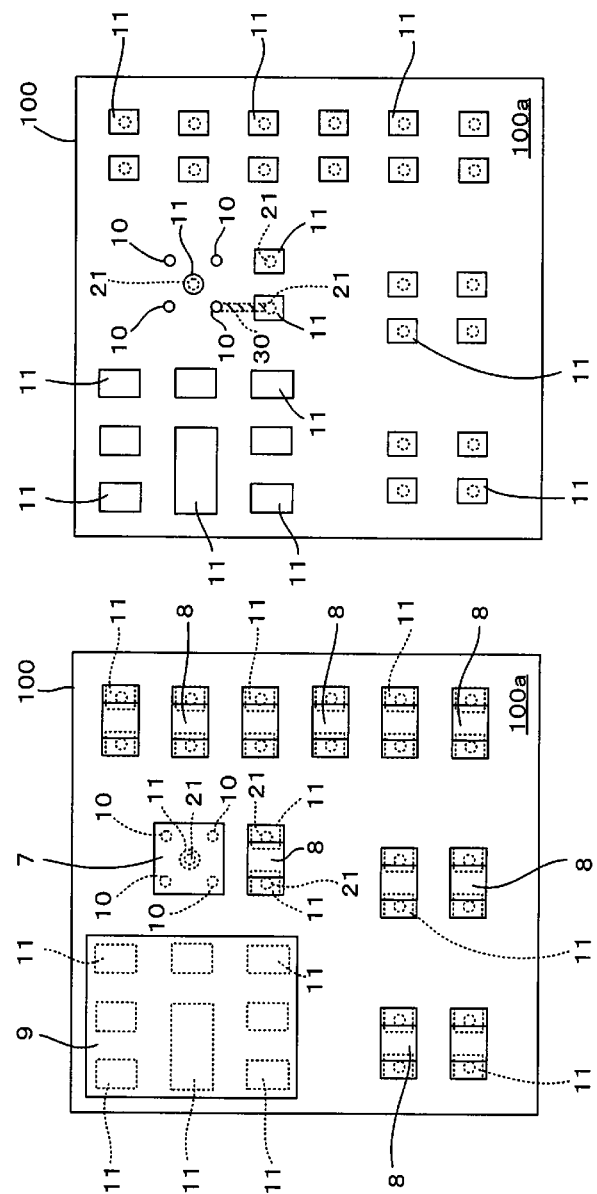

MULTILAYER WIRING BOARD

BACKGROUND OF THE INVENTION

1. Field of the Invention

The present invention relates to a multilayer wiring substrate including a multilayer body including a laminate of a plurality of insulating layers, and an internal wiring electrode provided in the multilayer body.

2. Description of the Related Art

As shown in FIG. 9, a module 500 including a multilayer wiring substrate 501 has been provided (for example, see Japanese Unexamined Patent Application Publication No. 2008-300482 (Paragraphs [0019] to [0050], FIG. 5, etc.)). FIG. 9 is an illustration showing a module including a multilayer wiring substrate of related art. The module 500 includes the multilayer wiring substrate 501, and a semiconductor element 502 (IC) mounted on a surface of the multilayer wiring substrate 501. The multilayer wiring substrate 501 includes a multilayer body 503 formed by laminating a plurality of insulating layers 503a, internal wiring electrodes 504 provided in the multilayer body 503, and a solder resist 505 provided on each of both surfaces of the multilayer body 503. Also, land electrodes 506, on which a component including the IC 502 is mounted, are provided on a first surface of the multilayer body 503, and connection electrodes 507 for external connection are provided on a second surface. Also, the internal wiring electrodes 504 each include a via conductor 504a and an in-plane conductor 504b provided at each of the insulating layers 503a. The via conductors 504a are connected to each other by the in-plane conductors 504b, and hence the IC 502 mounted on the land electrodes 506 at the first surface of the multilayer body 503 is connected to the connection electrodes 507 provided at the second surface of the multilayer body 503 by the internal wiring electrodes 504.

In recent years, an increase in functionality and a reduction in size of a communication mobile terminal, such as a cellular phone or a mobile information terminal, are promoted, and an increase in functionality and a reduction in size of the module 500 mounted on the communication mobile terminal and having various functions are also demanded. Hence, an increase in functionality and a reduction in size of a specific component, such as the IC 502 mounted on the multilayer wiring substrate 501 included in the module 500, are rapidly promoted, and it is required to mount a specific component, in which the number of pins of its input/output terminal is increased and the pitch of the pins is decreased, on the multilayer wiring substrate 501. Therefore, to meet the increase in the number of the pins and the decrease in the pitch between the pins of the input/output terminal of the specific component mounted on the multilayer wiring substrate 501, it is demanded to decrease the pitch between the land electrodes 506, which are provided on the first surface of the multilayer body 503 and to which the specific component is connected.

However, in the multilayer wiring substrate 501 in the related art, the land electrodes 506 and the via conductors 504a connected to the land electrodes 506 are formed via different processes. Therefore, there is a possibility that a positional shift between the via conductors 504a and the land electrodes 506 formed in the different processes is generated, as a result of which a connection failure occurs due to a processing error or a positional shift in the respective processes. Hence, in the related art, the land electrodes 506 having larger areas than end-surface areas of the via conductors 504a exposed from the first surface of the multilayer body 503 are formed, so that the connection failure between the via conductors 504a and the land electrodes 506 is prevented. However, the decrease in pitch between the land electrodes 506 is disturbed by the increase in area of the land electrodes 506 for ensuring connection reliability between the via conductors 504a and the land electrodes 506.

It could be possible to decrease the pitch between the land electrodes 506 by forming the land electrodes 506 with decreased areas on the first surface of the multilayer body 503. However, in general, a metal film made of, for example, Ni or Au is formed by plating on a plane electrode, such as the land electrode 506 exposed from the surface of the multilayer body 503, in order to prevent oxidation and to increase connectivity to an electrode or the like provided in another component. Accordingly, when the area of the plane electrode such as the land electrode 506 is reduced, there is a problem in which a plating film on the plane electrode is less likely to be formed.

SUMMARY OF THE INVENTION

In view of the above-described problems, preferred embodiments of the present invention provide a technique in which the area of a mounting electrode, which is provided on a first surface of a multilayer body and which specific components are connected to, is reduced, and in which the pitch between the mounting electrodes is decreased, and also provide a technique in which a plating film on each of the mounting electrodes with the reduced area is reliably formed.

A multilayer wiring substrate according to a preferred embodiment of the present invention includes a multilayer body including a laminate of a plurality of insulating layers; a first via conductor provided in the multilayer body, including a first end surface exposed from a first surface of the multilayer body, and defining a mounting electrode for connection with a specific component; a second via conductor provided in the multilayer body, and including first and second end surfaces, at least one of the first and second end surfaces being exposed from a surface of the multilayer body; a plane electrode provided on the at least one of the first and second end surfaces of the second via conductor exposed from the surface of the multilayer body; and an internal wiring electrode provided in the multilayer body, wherein the first via conductor is connected to the second via conductor with the internal wiring electrode interposed therebetween.

With a preferred embodiment of the present invention configured as described above, the mounting electrode for connection with the specific component is defined by the first end surface of the first via conductor exposed from the first surface of the multilayer body. Hence, since the mounting electrode for connection with the specific component is formed only by a process of forming the first via conductor, it is not required to consider a processing error or a positional shift of the via conductor and the plane electrode, unlike the related art. The mounting electrode with the reduced area is provided on the first surface of the multilayer body and defined by the first end surface of the first via conductor. Accordingly, the areas of mounting electrodes, which are provided on the first surface of the multilayer body and which specific components are connected to, are significantly reduced, and the pitch between the mounting electrodes is able to be decreased.

The multilayer body includes the second via conductor including first and second end surfaces, and at least one of the first and second end surfaces is exposed from the surface of the multilayer body. The plane electrode is provided on the at least one of the first and second end surfaces of the second via conductor exposed from the surface of the multilayer body. The first via conductor is connected to the second via conductor with the internal wiring electrode interposed therebetween which is provided in the multilayer body. Hence, the mounting electrode defined by the first end surface of the first via conductor is electrically connected with the plane electrode provided at the end surface of the second via conductor exposed from the surface of the multilayer body by the internal wiring electrode, and the area of the mounting electrode is ostensibly increased. When plating is applied, since the mounting electrode and the plane electrode electrically connected with the mounting electrode contact a chemical solution, a reduction-oxidation reaction in the mounting electrode is promoted. Accordingly, the plating film is able to be reliably formed on the mounting electrode with the reduced area.

Further, a plurality of the mounting electrodes defined by first end surfaces of a plurality of the first via conductors may be provided in a mounting region at the first surface of the multilayer body, the mounting region on which the specific component is mounted; a plurality of plane electrodes at end surfaces of a plurality of second via conductors exposed from the surface of the multilayer body may be provided in another region different from the mounting region of the multilayer body; and the plurality of first via conductors may be each connected to one of the plurality of second via conductors with the internal wiring electrode interposed therebetween.

With this configuration, since the plurality of mounting electrodes with the reduced areas defined by the first end surfaces of the plurality of first via conductors are provided in the mounting region at the first surface of the multilayer body, the mounting region on which the specific component is mounted, the gap between the mounting electrodes is reliably decreased in the mounting region on which the specific component is mounted. The plurality of plane electrodes at the end surfaces of the plurality of second via conductors exposed from the surface of the multilayer body are provided in the other region different from the mounting region of the multilayer body. The plurality of first via conductors are each connected to one of the plurality of second via conductors by the internal wiring electrode. Accordingly, since the plurality of mounting electrodes defined by the first end surfaces of the plurality of first via conductors are each electrically connected with one of the plurality of plane electrodes at the end surfaces of the plurality of second via conductors exposed from the surface of the multilayer body, the plating film is able to be reliably formed on each of the mounting electrodes.

The multilayer body may include a ceramic multilayer body including a laminate of a plurality of ceramic insulating layers; and the first via conductor may be defined by a first conductive paste in which a ceramic material is contained.

With this configuration, since the first via conductor is defined by the first conductive paste in which the ceramic material is contained, when the ceramic multilayer body is sintered, the difference in contraction ratio between the ceramic insulating layer and the first via conductor is significantly reduced. Accordingly, when the ceramic multilayer body is sintered, a gap is prevented from being generated at a boundary portion between the first via conductor and the ceramic insulating layer. Since the first via conductor is electrically connected with the plane electrode at the end surface of the second via conductor exposed from the surface of the multilayer body, the plating film is able to be reliably formed on the mounting electrode.

The plane electrode may be defined by a second conductive paste, in which a content of Cu in the second conductive paste is larger than a content of Cu in the first conductive paste.

With this configuration, since the content of Cu of the plane electrode electrically connected with the mounting electrode is able to be increased, the plating film is able to be further reliably formed on the mounting electrode.

An area of the plane electrode may be larger than an area of the first end surface of the first via conductor exposed from the first surface of the multilayer body.

With this configuration, since the area of the plane electrode electrically connected with the mounting electrode which is defined by the first end surface of the first via conductor is able to be increased, the area of the plane electrode that contacts a chemical solution when plating is applied to the mounting electrode is further increased. Accordingly, the plating film is able to be further reliably provided on the mounting electrode.

Also, the plane electrode may be arranged adjacent to the mounting electrode.

With this configuration, since the mounting electrode is arranged adjacent to the plane electrode connected to the mounting electrode, the plating film is able to be reliably provided on the mounting electrode, excessive wiring is omitted, and the multilayer wiring substrate is able to be reduced in size.

The mounting electrode may include two mounting electrodes, and the plane electrode may be arranged between the two mounting electrodes.

With this configuration, since the plane electrode is arranged between the two mounting electrodes, the plating film is able to be reliably provided on the mounting electrode, excessive wiring is omitted, and the multilayer wiring substrate is able to be reduced in size.

Also, the plane electrode may be a dummy electrode on which a component is not mounted.

With this configuration, since the mounting electrode is electrically connected with the plane electrode defined by the dummy electrode, the multilayer wiring substrate in which non-adhesion of the plating film to the mounting electrode is reliably prevented is provided.

A matching circuit or a component defining a bypass capacitor may be mounted on the plane electrode.

With this configuration, since the matching circuit or the component defining the bypass capacitor is mounted on the plane electrode in which non-adhesion of the plating film on the mounting electrode is able to be prevented by connecting the plane electrode to the mounting electrode, the multilayer wiring substrate with a useful configuration is able to be provided.

According to various preferred embodiments of the present invention, since the mounting electrodes with the reduced areas are defined at the first surface of the multilayer body by the first end surfaces of the first via conductors, the areas of the mounting electrodes, which are provided on the first surface of the multilayer body and which the specific components are connected to, are significantly reduced, and the pitch between the mounting electrodes is significantly decreased. Since the first via conductor is connected to the second via conductor with the internal wiring electrode interposed therebetween which is provided in the multilayer body, the mounting electrode defined by the first end surface of the first via conductor is electrically connected with the plane electrode at the end surface of the second via conductor exposed from the surface of the multilayer body by the internal wiring electrode, and the area of the mounting electrode is ostensibly increased. When plating is applied, since the mounting electrode and the plane electrode electrically connected with the mounting electrode contact a chemical solution, a reduction-oxidation reaction in the mounting electrode is promoted. Accordingly, the plating film is able to be reliably formed on the mounting electrode with the reduced area.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a circuit block diagram of the front end module of FIG. 1.

FIGS. 3A and 3B show an arrangement example (1), where FIG. 3A is an illustration showing the arrangement relationship between a component and an electrode, and FIG. 3B is an illustration showing a connection state by an internal wiring electrode.

FIG. 4A is an illustration showing the arrangement relationship between a component and an electrode, and FIG. 4B is an illustration showing a connection state by an internal wiring electrode.

FIG. 5A is an illustration showing the arrangement relationship between a component and an electrode, and FIG. 5B is an illustration showing a connection state by an internal wiring electrode.

FIGS. 6A and 6B show an arrangement example (4), where FIG. 6A is an illustration showing the arrangement relationship between a component and an electrode, and FIG. 6B is an illustration showing a connection state by an internal wiring electrode.

FIG. 7A is an illustration showing the arrangement relationship between a component and an electrode, and FIG. 7B is an illustration showing a connection state by an internal wiring electrode.

FIG. 8A is an illustration showing the arrangement relationship between a component and an electrode, and FIG. 8B is an illustration showing a connection state by an internal wiring electrode.

DETAILED DESCRIPTION OF THE PREFERRED EMBODIMENTS

Figure 1:
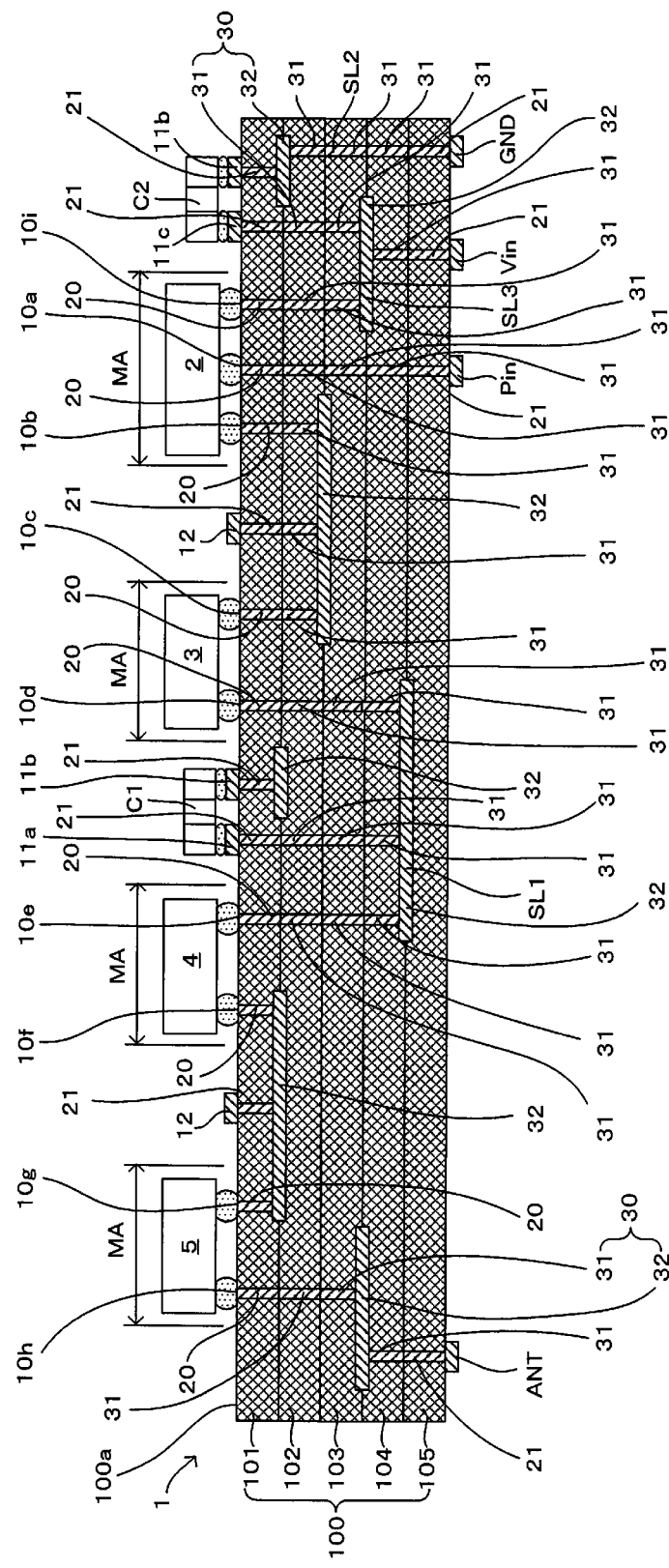
FIG. 1 is an illustration showing a front end module including a multilayer wiring substrate according to a preferred embodiment of the present invention.

A preferred embodiment of the present invention is described with reference to FIGS. 1 and 2. FIG. 1 is an illustration showing a front end module including a multilayer wiring substrate according to a preferred embodiment of the present invention. FIG. 2 is a circuit block diagram of the front end module in FIG. 1. FIGS. 1 and 2 illustrate only main configurations and omit the other configurations for simple description.

The front end module (communication module) shown in FIG. 1 is mounted on a mother board or the like included in a communication mobile terminal having a communication function, such as a cellular phone or a mobile information terminal. The front end module is connected directly below an antenna element (not shown) included in the communication mobile terminal. In this preferred embodiment, the front end module includes a RFIC 2, a power amplifier 3, a filter circuit component 4, and a switch IC 5 corresponding to "specific components". Also, the front end module includes a multilayer wiring substrate 1 on which the specific components 2 to 5 are mounted. Also, the RFIC 2, the power amplifier 3, the filter circuit component 4, and the switch IC 5 are mounted by soldering or other method in mounting regions MA at a first surface 100$a$ of a multilayer body 100 included in the multilayer wiring substrate 1. Also, components, such as a capacitor C1 and an inductor L1 defining a matching circuit 6, and a component such as a capacitor C2 defining a bypass capacitor are mounted by soldering or other method in the other regions different from the mounting regions MA of the multilayer body 100.

The RFIC 2 has a function of demodulating a reception signal (RF signal) input to the front end module from the antenna element of the communication mobile terminal through a common electrode ANT (plane electrode) into a baseband signal and processing the baseband signal, and modulating a baseband signal generated by the communication mobile terminal and input to the front end module through an input electrode Pin into a RF signal (transmission signal) by a specific modulation method and outputting the RF signal. In this preferred embodiment, the baseband signal is input to the RFIC 2 through the input electrode Pin and a mounting electrode 10$a$, and the transmission signal obtained by modulating the baseband signal is output from the RFIC 2 through a mounting electrode 10$b$.

The power amplifier 3 amplifies the signal level of the transmission signal input through a mounting electrode 10$c$ and output from the RFIC 2. The transmission signal with the signal level amplified by the power amplifier 3 is output through a mounting electrode 10$d$. The power amplifier 3 is preferably defined by a general power amplifying element, such as a heterojunction bipolar transistor or an electric-field transistor, for example.

The matching circuit 6 matches an output impedance of the power amplifier 3 with an input impedance of the filter circuit component 4. The inductor L1 defining the matching circuit 6 is connected in series to a signal line SL1 that connects the power amplifier 3 with the filter circuit component 4. Also, a first end of the capacitor C1 defining the matching circuit 6 is connected to a land electrode 11$a$ (plane electrode) connected to an internal wiring electrode 30 forming the signal line SL1 that connects the inductor L1 with an output end of the power amplifier 3. Also, a second end of the capacitor C1 is connected to a land electrode 11$b$ (plane electrode) connected to an internal wiring electrode 30 defining a ground line SL2 connected to a ground electrode GND (plane electrode).

The filter circuit component 4 allows a RF signal in a specific frequency band to pass through. The transmission signal output from the matching circuit 6 is input to the filter circuit component 4 through a mounting electrode 10$e$. Accordingly, a transmission signal in which unnecessary signal components such as harmonic components have been removed is output through a mounting electrode 10$f$. The filter circuit component 4 is defined by a general filter circuit such as a SAW (surface acoustic wave) filter element, a BAW (bulk acoustic wave) filter element, a LC filter, or a dielectric filter, for example.

The switch IC 5 selectively connects one of a plurality of signal terminals (not shown) including a signal terminal connected to a mounting electrode 10g with a common terminal (not shown) connected to a mounting electrode 10h and the common electrode ANT. Since the common terminal connected to the common electrode ANT through the mounting electrode 10h is connected to the signal terminal connected to the mounting electrode 10g in the switch IC 5, the transmission signal output from the filter circuit component 4 and input to the switch IC 5 through the mounting electrode 10g is output from the common electrode ANT through the mounting electrode 10h.

The RFIC 2, the power amplifier 3, and the switch IC 5 are each connected to a mounting electrode 10i for power supply connected to an internal wiring electrode 30 defining a power line SL3 which is connected to a power supply electrode Vin (plane electrode) that is connected to an external power supply (not shown), and hence the power is supplied. Also, the RFIC 2, the power amplifier 3, and the switch IC 5 are each provided with a capacitor C2 defining a bypass capacitor. A first end of the capacitor C2 is connected to a land electrode 11c (plane electrode) connected to the internal wiring electrode 30 defining the power supply line SL3. Also, a second end of the capacitor C2 is connected to a land electrode 11b connected to the internal wiring electrode 30 defining the ground line SL2.

Next, the multilayer wiring substrate 1 is described mainly with reference to FIG. 1.

The multilayer wiring substrate 1 includes the multilayer body 100 including a laminate of five insulating layers 101 to 105, for example. Also, the multilayer body 100 includes first via conductors 20 and second via conductors 21. First end surfaces of the first via conductors 20 are exposed from the first surface 100a of the multilayer body. The first via conductors 20 define the mounting electrodes 10a to 10i for connection with the specific components, such as the RFIC 2, the power amplifier 3, the filter circuit component 4, and the switch IC 5. The second via conductors 21 each include first and second surfaces, at least one of the first and second surfaces being exposed from a surface of the multilayer body 100. Also, at end surfaces of the plurality of second via conductors 21 exposed from the surface of the multilayer body 100, the plane electrodes, such as the common electrode ANT, the input electrode Pin, the ground electrode GND, the power supply electrode Vin, the land electrodes 11a to 11c, and a dummy electrode 12 (hereinafter, referred to as "plane electrodes ANT, Pin, GND, Vin, 11a to 11c, and 12") are provided.

Each of the above-described plane electrodes ANT, Pin, GND, Vin, 11a to 11c, and 12 has a structure such that the area thereof is larger than the area of the first end surface of the first via conductor 20 exposed from the first surface 100a of the multilayer body 100. The dummy electrode 12 is an electrode on which any one of various components including the above-described components is not mounted.

The plurality of mounting electrodes 10a to 10i are provided in the mounting regions MA at the first surface 100a of the multilayer body 100, the mounting regions MA in which the specific components such as the above-described RFIC 2, power amplifier 3, filter circuit component 4, and switch IC 5 are mounted. The mounting electrodes 10a to 10i are defined by the first end surfaces of the plurality of first via conductors 20. A portion of the plurality of plane electrodes ANT, Pin, GND, Vin, 11a to 11c, and 12 described above and provided in the other regions different from the mounting regions MA of the multilayer body 100 is arranged adjacent to one of the mounting electrodes 10a to 10i or arranged between two of the mounting electrodes 10a to 10i.

In the multilayer body 100, the internal wiring electrodes 30, which include a plurality of third via conductors 31 and a plurality of in-plane conductors 32, provided at the respective insulating layers 102 to 104 such that both end surfaces of the third via conductors 31 are not exposed from the surface of the multilayer body 100, are provided. As shown in FIG. 1, the plurality of first via conductors 20 are each connected to one of the plurality of second via conductors 21 with the internal wiring electrode 30 interposed therebetween. Hence, the mounting electrodes 10a to 10i defined by the end surfaces of the first via conductors 20 exposed from the first surface 100a of the multilayer body 100 are each connected to one of the above-described plane electrodes ANT, Pin, GND, Vin, 11a to 11c, and 12 in which the areas thereof are larger than the areas of the mounting electrodes 10a to 10i.

In this preferred embodiment, the multilayer body 100 preferably is a ceramic multilayer body including the laminate of the plurality of insulating layers 101 to 105 defined by ceramic green sheets that have been laminated and fired. That is, the ceramic green sheets defining the insulating layers 101 to 105 are formed preferably by forming, into a sheet, slurry in which mixed powder including alumina, glass, or the like is mixed with an organic binder, a solvent, and the like with a shaping tool, and then the ceramic green sheets are sintered at a low temperature of about 1000° C., so-called low-temperature firing. Thereafter, the ceramic green sheets are cut into a predetermined shape and via holes are formed in the cut ceramic green sheets by laser processing. The formed via holes are filled with a conductive paste containing, for example, Ag, Cu, or the like, or are processed by via filling plating, whereby, the via conductors 20, 21, and 31 for interlayer connection are formed. The various in-plane conductors 32 and the plane electrodes ANT, Pin, GND, Vin, 11a to 11c, and 12 at the surface of the multilayer body 100 are formed preferably by applying a conductive paste containing, for example, Ag, Cu, or the like. Thus, the respective insulating layers 101 to 105 are formed.

In this preferred embodiment, each of the via conductors 20, 21, and 31 preferably is formed of a first conductive paste in which a ceramic material similar to the material of the each of insulating layers 101 to 105 is contained. Each of the plane electrodes ANT, Pin, GND, Vin, 11a to 11c, and 12 at the surface of the multilayer body 100 preferably is formed of a second conductive paste, in which a content of Cu is larger than that of the first conductive paste. It is preferable that the second conductive paste may be substantially pure copper.

A circuit element such as a capacitor, an inductor or the like may be defined by the respective via conductors 20, 21, and 31, and the in-plane conductors 32 provided in the respective insulating layers 101 to 105, and a filter circuit or a matching circuit may be defined by the circuit element such as the capacitor, the inductor, or the like. The multilayer wiring substrate 1 may be formed with resin, a polymer material, or the like. The number of layers or the like of the multilayer wiring substrate 1 is not limited to the above-described configuration, and the design may be properly changed in accordance with the purpose of use of the front end module. The respective plane electrodes ANT, Pin, GND, Vin, 11a to 11c, and 12 at the surface of the multilayer body 100 may be formed by etching a Cu layer formed on the surface of the multilayer body 100 by photolithography or other method.

Next, other examples of the arrangement relationship among mounting electrodes 10 defined by first end surfaces of first via conductors 20, land electrodes 11 (plane electrodes) defined at end surfaces of second via conductors 21 exposed from the surface of the multilayer body 100, and dummy electrodes 12, with reference to FIGS. 3A to 8B. FIGS. 3A to 8B each provide illustrations of arrangement examples (1) to (6), with FIGS. 3A, 4A, 5A, 6A, 7A and 8A being an illustration showing the arrangement relationship between a component and an electrode, and FIGS. 3B, 4B, 5B, 6B, 7B and 8B being an illustration showing a connection state by an internal wiring electrode 30. In the arrangement examples described below, among the plurality of mounting electrodes 10 shown in the respective drawings, only connection states of portions of the mounting electrodes 10, land electrodes 11, and dummy electrodes 12 are illustrated.

(1) Arrangement Example (1)

In arrangement example (1), as shown in FIG. 3A, a specific component 7 is mounted on four mounting electrodes 10 arranged adjacent to four corners of a rectangular or substantially rectangular shape and a land electrode 11 arranged at substantially the center of the mounting electrodes 10. As shown in FIG. 3B, the mounting electrode 10 at the lower left in the drawing is connected to a second via conductor 21 connected to the land electrode 11, by an internal wiring electrode 30.

(2) Arrangement Example (2)

Figure 4A:
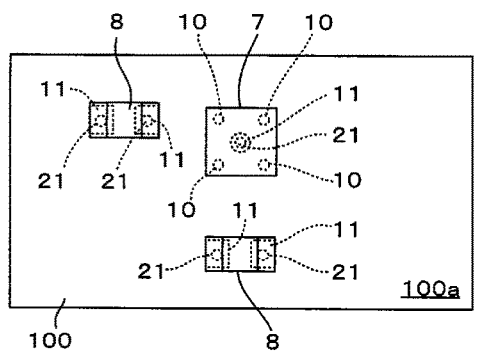
FIGS. 4A and 4B show an arrangement example (2), where
Figure 4B:
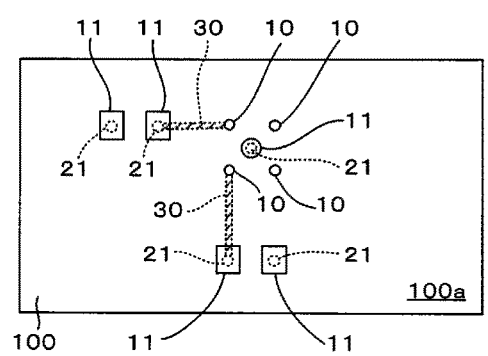

In arrangement example (2), as shown in FIG. 4A, chip components 8 are mounted on a plurality of land electrodes 11 arranged around the specific component 7. As shown in FIG. 4B, a lower left mounting electrode 10 in the drawing is connected to a second via conductor 21 connected to the land electrode 11 arranged next to the mounting electrode 10 at the lower side by an internal wiring electrode 30. An upper left mounting electrode 10 in the drawing is connected to a via conductor 21 connected to the land electrode 11 arranged next to the mounting electrode 10 at the left side by an internal wiring electrode 30.

(3) Arrangement Example (3)

Figure 5A:
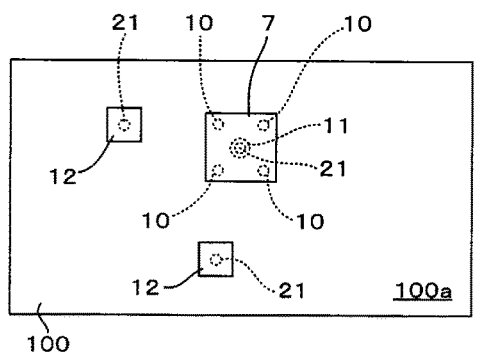
FIGS. 5A and 5B show an arrangement example (3), where
Figure 5B:
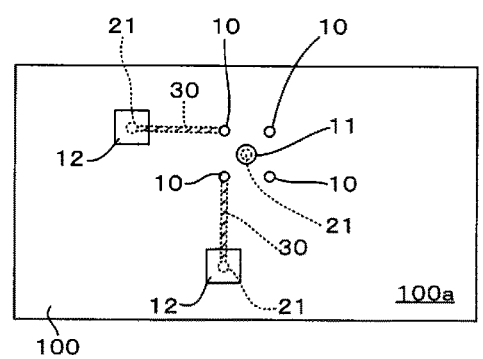

In arrangement example (3), as shown in FIG. 5A, a plurality of dummy electrodes 12 connected to second via conductors 21 are arranged around a specific component 7. Also, as shown in FIG. 5B, a lower left mounting electrode 10 in the drawing is connected to the second via conductor 21 connected to the dummy electrode 12 arranged next to the mounting electrode 10 at the lower side by an internal wiring electrode 30. An upper left mounting electrode 10 in the drawing is connected to the via conductor 21 connected to the dummy electrode 12 arranged next to the mounting electrode 10 at the left side by an internal wiring electrode 30.

(4) Arrangement Example (4)

In arrangement example (4), as shown in FIG. 6A, chip components 8 and an IC 9 are mounted on a plurality of land electrodes 11 arranged around a specific component 7. As shown in FIG. 6B, a lower left mounting electrode 10 in the drawing is connected to a second via conductor 21 connected to the land electrode 11 adjacent to the mounting electrode 10 at the lower side, by an internal wiring electrode 30.

(5) Arrangement Example (5)

Figure 7A:
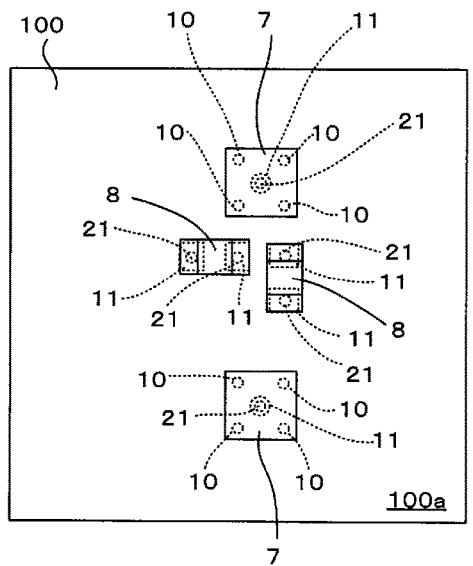
FIGS. 7A and 7B show an arrangement example (5), where
Figure 7B:
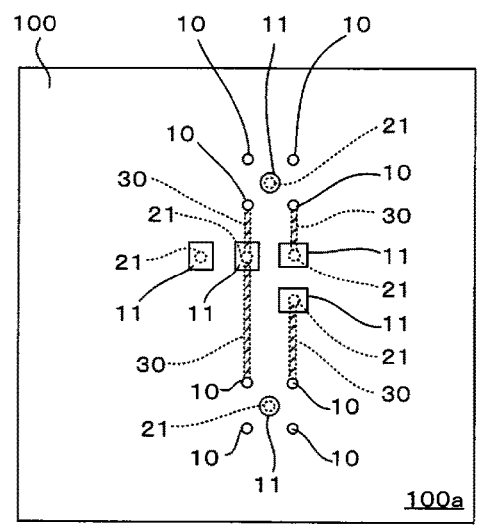

In arrangement example (5), as shown in FIG. 7A, two specific components 7 are mounted, and chip components 8 are mounted on a plurality of land electrodes 11 between both the specific components 7. As shown in FIG. 7B, a lower left mounting electrode 10 among mounting electrodes 10 with the upper specific component 7 in the drawing mounted is connected to a second via conductor 21 connected to the land electrode 11 arranged adjacent to the mounting electrode 10 at the lower side by an internal wiring electrode 30. A lower right mounting electrode 10 is connected to a second via conductor 21 connected to the land electrode 11 arranged adjacent to the mounting electrode 10 at the lower side by an internal wiring electrode 30. Also, an upper left mounting electrode 10 among the mounting electrodes 10 with the lower specific component 7 in the drawing mounted is connected to the second via conductor 21 connected to the land electrode 11 arranged adjacent to the mounting electrode 10 at the upper side by an internal wiring electrode 30. An upper right mounting electrode 10 is connected to a second via conductor 21 connected to the land electrode 11 arranged adjacent to the upper right mounting electrode 10 at the upper side by an internal wiring electrode 30.

(6) Arrangement Example (6)

Figure 8A:
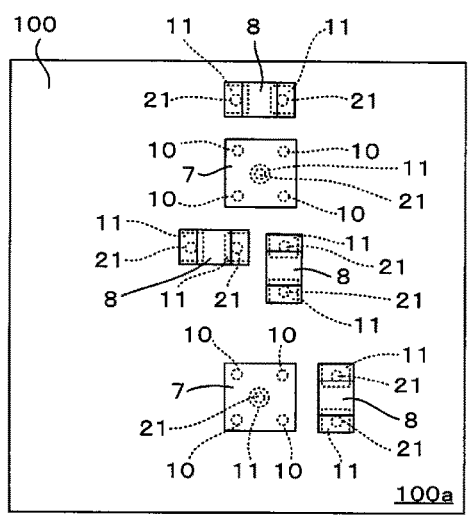
FIGS. 8A and 8B show an arrangement example (6), where
Figure 8B:
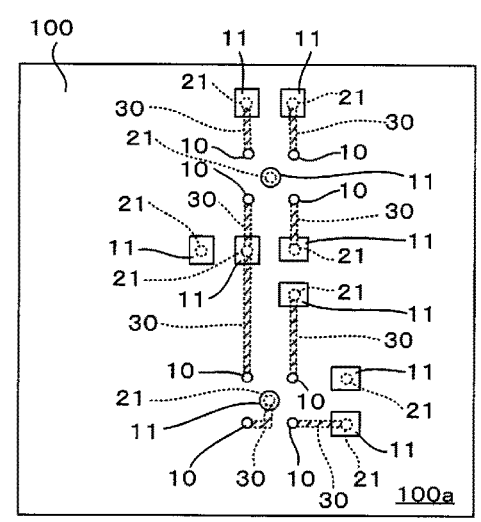
Figure 9:
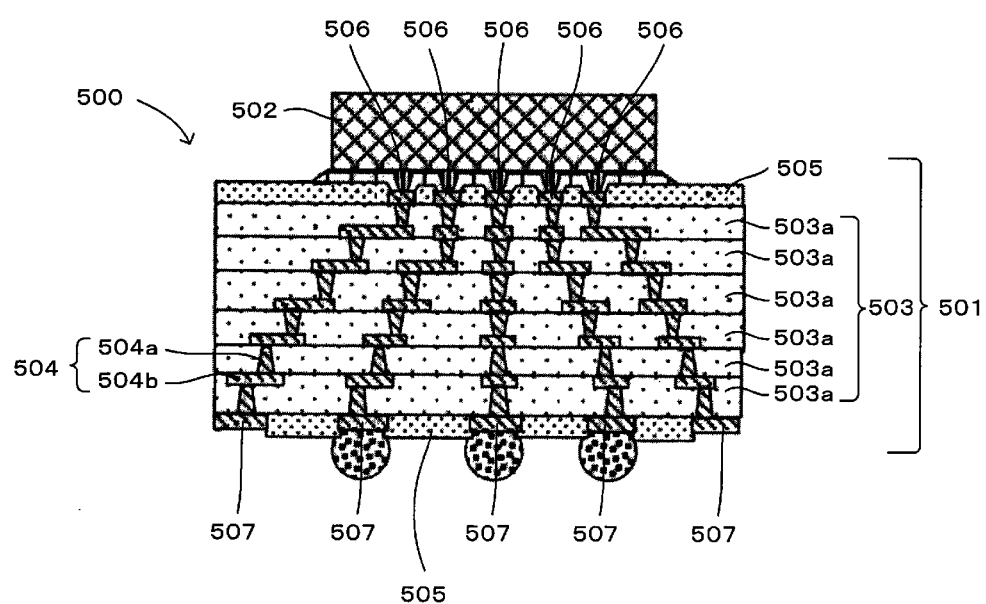
FIG. 9 is an illustration showing a module including a multilayer wiring substrate of related art.

In arrangement example (6), as shown in FIG. 8A, a chip component 8 is further mounted on land electrodes 11 located at the upper side of the upper specific component 7 in the arrangement example (5), and a chip component 8 is further mounted on land electrodes 11 located at the right side of the lower specific component 7. As shown in FIG. 8B, in addition to the connection state shown in FIG. 7B, an upper left mounting electrode 10 among the mounting electrodes 10 with the upper specific component 7 in FIG. 8B mounted is connected to a second via conductor 21 connected to the land electrode 11 arranged next to the mounting electrode 10 at the upper side by an internal wiring electrode 30. An upper right mounting electrode 10 is connected to a second via conductor 21 connected to the land electrode 11 arranged adjacent to the mounting electrode 10 at the upper side by an internal wiring electrode 30. Also, a lower left mounting electrode 10 among the mounting electrodes 10 with the lower specific component 7 in FIG. 8B mounted is connected to a second via conductor 21 connected to a land electrode 11 arranged at the center of the mounting electrodes 10 by an internal wiring electrode 30. A lower right mounting electrode 10 is connected to a second via conductor 21 connected to the land electrode 11 arranged at the right side of the lower right mounting electrode 10 by an internal wiring electrode 30.

As described above, in this preferred embodiment, the mounting electrodes 10 and 10a to 10i for connection with the specific components such as the RFIC 2, the power amplifier 3, the filter circuit component 4, and the switch IC 5 are defined by the first end surfaces of the first via conductors 20 exposed from the first surface 100a of the multilayer body 100. Hence, since the mounting electrodes 10 and 10a to 10i for connection with the specific components are formed only by a process of forming the first via conductors 20, it is not required to consider a processing error or a positional shift of a via conductor and a plane electrode unlike the related art. Thus, the mounting electrodes 10 and 10a to 10i with the reduced areas are able to be provided at the first surface of the multilayer body 100 by the first end surfaces of the first via conductors 20. Accordingly, the areas of the mounting electrodes 10 and 10a to 10i, which are provided at the first surface 100a of the multilayer body 100 and to which the specific components are connected, are significantly reduced and the pitch between the mounting electrodes 10 and 10a to 10i are significantly decreased.

The multilayer body 100 includes the second via conductors 21 each including the first and second end surfaces, at least one of the first and second end surfaces being exposed from the surface of the multilayer body 100. Also, the plane electrodes ANT, Pin, GND, Vin, 11a to 11c, and 12 are provided at the end surfaces of the second via conductors 21 exposed from the surface of the multilayer body 100. The first via conductors 20 are connected to the second via conductors 21 with the internal wiring electrodes 30 interposed therebetween, which is provided in the multilayer body 100. Hence, the mounting electrodes 10 and 10a to 10i defined by the first end surfaces of the first via conductors 20 are electrically connected with the plane electrodes ANT, Pin, GND, Vin, 11a to 11c, and 12 at the end surfaces of the second via conductors 21 exposed from the surface of the multilayer body 100 by the internal wiring electrodes 30, and the areas of the mounting electrodes 10 and 10a to 10i are ostensibly increased. When plating is applied, since the mounting electrodes 10 and 10a to 10i and the plane electrodes ANT, Pin, GND, Vin, 11a to 11c, and 12 electrically connected with the mounting electrodes 10 and 10a to 10i contact a chemical solution, a reduction-oxidation reaction in the mounting electrodes 10 and 10a to 10i is promoted. Accordingly, the plating film is able to be reliably provided on each of the mounting electrodes 10 and 10a to 10i with the reduced areas.

Since the mounting electrodes 10 and 10a to 10i are electrically connected with the plane electrodes ANT, Pin, GND, Vin, 11a to 11c, and 12 by the internal wiring electrodes 30, the formation of the plating film on each of the mounting electrodes 10 and 10a to 10i is promoted. The reason of the promotion of the plating film may be considered as follows. That is, when a specific metal film is formed by electroless plating on the mounting electrodes 10 and 10a to 10i, electrons emitted from a reductant adhered to the plane electrodes ANT, Pin, GND, Vin, 11a to 11c, and 12 are provided to the mounting electrodes 10 and 10a to 10i through the internal wiring electrodes 30. Then, at the surfaces of the mounting electrodes 10 and 10a to 10i, the electrons provided from the plane electrodes ANT, Pin, GND, Vin, 11a to 11c, and 12 are received by metal ions, such that metal (plating film) is deposited on each of the surfaces of the mounting electrodes 10 and 10a to 10i. Hence, with electroless plating, a plating film is more likely to be formed on metal as the area being in contact with a chemical solution used by electroless plating increases in the entire area of metal materials electrically connected with each other.

Since there are provided the plurality of mounting electrodes 10 and 10a to 10i with the reduced areas defined by the first end surfaces of the plurality of first via conductors 20 in the mounting regions MA at the first surface 100a of the multilayer body 100, the mounting regions MA in which the specific components such as the RFIC 2, the power amplifier 3, the filter circuit component 4, or the switch IC 5 are mounted, the gaps of the mounting electrodes 10 and 10a to 10i are able to be reliably decreased in the mounting regions MA on which the specific components are mounted. The plurality of plane electrodes ANT, Pin, GND, Vin, 11a to 11c, and 12 provided at the end surfaces of the plurality of second via conductors 21 exposed from the surface of the multilayer body 100 are provided in the other regions different from the mounting regions MA of the multilayer body 100. The plurality of first via conductors 20 are each connected to one of the plurality of second via conductors 21 by the internal wiring electrode 30. Hence, the mounting electrodes 10 and 10a to 10i defined by the first end surfaces of the first via conductors 20 are each electrically connected with one of the plane electrodes ANT, Pin, GND, Vin, 11a to 11c, and 12 at the end surfaces of the second via conductors 21 exposed from the surface of the multilayer body 100, and the plating film is able to be reliably provided on each of the mounting electrodes 10 and 10a to 10i.

Since the via conductors 20, 21, and 31 are defined by the first conductive paste in which the ceramic material is contained, when the ceramic multilayer body 100 is sintered, the difference in contraction ratio between the ceramic insulating layers 101 to 105 and the via conductors 20, 21, and 31 is significantly reduced. Accordingly, when the ceramic multilayer body 100 is sintered, a gap is prevented from being generated at boundary portions between the via conductors 20, 21, and 31 and the ceramic insulating layers 101 to 105. Since the first via conductors 20 are electrically connected with the plane electrodes ANT, Pin, GND, Vin, 11a to 11c, and 12 at the end surfaces of the second via conductors 21 exposed from the surface of the multilayer body 100, the plating film is able to be reliably provided on each of the mounting electrodes 10 and 10a to 10i.

The respective plane electrodes ANT, Pin, GND, Vin, 11a to 11c, and 12 are defined by the second conductive paste, in which a content of Cu in the second conductive paste is larger than that in the first conductive paste. Accordingly, since the content of Cu in the plane electrodes ANT, Pin, GND, Vin, 11a to 11c, and 12 electrically connected with the mounting electrodes 10 and 10a to 10i is able to be increased, the plating film is able to be further reliably provided on each of the mounting electrodes 10 and 10a to 10i.

The areas of the plane electrodes ANT, Pin, GND, Vin, 11a to 11c, and 12 electrically connected with the mounting electrodes 10 and 10a to 10i defined by the first end surfaces of the first via conductors 20 are larger than the areas of the first end surfaces of the first via conductors 20. Accordingly, since the areas of the plane electrodes ANT, Pin, GND, Vin, 11a to 11c, and 12 that contact a chemical solution when plating is applied to the mounting electrodes 10 and 10a to 10i is able to be increased, the plating film is able to be further reliably provided on each of the mounting electrodes 10 and 10a to 10i.

Also, since the mounting electrodes 10 and 10a to 10i are each arranged adjacent to one of the plane electrodes ANT, Pin, GND, Vin, 11a to 11c, and 12 connected to the mounting electrodes 10 and 10a to 10i, the plating film is reliably provided on each of the mounting electrodes 10 and 10a to 10i, excessive wiring is omitted, and the multilayer wiring substrate 1 is able to be significantly reduced in size. Also, since the plane electrodes ANT, Pin, GND, Vin, 11a to 11c, and 12 connected to the mounting electrodes 10 and 10a to 10i are each arranged between two of the mounting electrodes 10 and 10a to 10i, the plating film is reliably provided on each of the mounting electrodes 10 and 10a to 10*i*, excessive wiring is omitted, and the multilayer wiring substrate 1 is able to be significantly reduced in size.

Since the mounting electrodes 10, 10*b*, 10*c*, 10*f*, and 10*g* are electrically connected with the plane electrodes defined by the dummy electrodes 12, the multilayer wiring substrate 1 is able to be provided, in which non-adhesion of the plating film on each of the mounting electrodes 10, 10*b*, 10*c*, 10*f*, and 10*g* is reliably prevented.

Since the matching circuit 6 or the capacitor C2 defining the bypass capacitor is mounted on the land electrodes 11*a* and 11*c* in which non-adhesion of the plating film on each of the mounting electrodes 10*e* and 10*i* is prevented by connecting of the land electrodes 11*a* and 11*c* to the mounting electrodes 10*e* and 10*i*, the multilayer wiring substrate 1 with a useful configuration is able to be provided.

The present invention is not limited to the above-described preferred embodiments, and various modifications may be made in addition to the above-described modifications without departing from the scope of the present invention. The configurations of the above-described preferred embodiment may be combined in a desirable manner. For example, the module including the multilayer wiring substrate 1 according to the present invention is not limited to the above-described front end module. Any one of various high-frequency modules, such as a switch module and a communication module, and a power supply module may include the multilayer wiring substrate 1 according to various preferred embodiments of the present invention. Also, the specific components according to various preferred embodiments of the present invention mounted on the multilayer wiring substrate 1 are not limited to the above-described examples. A component in which the number of pins is increased and the pitch of the pins is decreased, such as any one of various IC components, may be mounted as a specific component on the multilayer wiring substrate 1.

Various preferred embodiments of the present invention can be widely applied to a multilayer wiring substrate including a multilayer body including a laminate of a plurality of insulating layers, and an internal wiring electrode provided in the multilayer body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer wiring substrate comprising:
   a multilayer body including a laminate of a plurality of insulating layers;
   a plurality of first via conductors provided in the multilayer body, each including a first end surface exposed from a first surface of the multilayer body, and defining a mounting electrode for connection with a specific component;
   a plurality of second via conductors provided in the multilayer body, each including a first end surface exposed from the first surface of the multilayer body; and
   an internal wiring electrode provided in the multilayer body; wherein
   the plurality of mounting electrodes defined by the first end surfaces of the plurality of first via conductors are provided in a mounting region of the first surface of the multilayer body on which the specific component is mounted;
   a plurality of plane electrodes located on the first end surfaces of the plurality of second via conductors exposed from the first surface of the multilayer body are provided in another region different from the mounting region of the multilayer body; and
   each of the plurality of first via conductors is connected to one of the plurality of second via conductors with the internal wiring electrode interposed therebetween.

2. The multilayer wiring substrate according to claim 1, wherein
   the multilayer body is a ceramic multilayer body including a laminate of a plurality of ceramic insulating layers; and
   the plurality of first via conductors includes a first conductive paste in which a ceramic material is contained.

3. The multilayer wiring substrate according to claim 2, wherein the plurality of plane electrodes includes a second conductive paste, in which a content of Cu in the second conductive paste is larger than a content of Cu in the first conductive paste.

4. The multilayer wiring substrate according to claim 1, wherein an area of each of the plurality of plane electrodes is larger than an area of each of the first end surfaces of the plurality of first via conductors exposed from the first surface of the multilayer body.

5. The multilayer wiring substrate according to claim 1, wherein the plurality of plane electrodes are arranged adjacent to the plurality of mounting electrodes.

6. The multilayer wiring substrate according to claim 1, wherein
   one of the plurality of plane electrodes is arranged between the two of the plurality of mounting electrodes.

7. The multilayer wiring substrate according to claim 1, wherein at least one of the plurality of plane electrodes is a dummy electrode on which a component is not mounted.

8. The multilayer wiring substrate according to claim 1, wherein a matching circuit or a component defining a bypass capacitor is mounted on at least one of the plane electrodes.

9. A front end module comprising the multilayer wiring substrate according to claim 1.

10. The front end module according to claim 9, further comprising a radio frequency integrated circuit, a power amplifier, a filter circuit component, and a switch integrated circuit.

11. The front end module according to claim 10, wherein the radio frequency integrated circuit demodulates a reception signal input to the front end module from an antenna element of a communication mobile terminal through a common electrode into a baseband signal and processes the baseband signal, and modulates a baseband signal generated by the communication mobile terminal and input to the front end module through an input electrode into a RF signal.

12. A communication mobile terminal comprising the front end module according to claim 9.

13. The multilayer wiring substrate according to claim 1, wherein a capacitor and an inductor defining a matching circuit are provided on the multilayer body.

14. The multilayer wiring substrate according to claim 1, wherein a bypass capacitor is mounted on the multilayer body.

15. A high-frequency module comprising the multilayer wiring substrate according to claim 1.

16. The high-frequency module according to claim 15, wherein the high-frequency module is one of a switch module, a communication module, and a power supply module.

17. The multilayer wiring substrate according to claim 1, wherein a plating film is provided on the plurality of mounting electrodes.

\* \* \* \* \*